(12) United States Patent
Tanaka (10) Patent No.: US 11,824,055 B2
(45) Date of Patent: Nov. 21, 2023

(54) SEMICONDUCTOR INTEGRATED CIRCUIT DEVICE

(71) Applicant: Socionext Inc., Kanagawa (JP)

(72) Inventor: Hidetoshi Tanaka, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 17/735,052

(22) Filed: May 2, 2022

(65) Prior Publication Data

US 2022/0262787 A1 Aug. 18, 2022

Related U.S. Application Data

(63) Continuation of application No. PCT/JP2020/039593, filed on Oct. 21, 2020.

(30) Foreign Application Priority Data

Nov. 6, 2019 (JP) .................................. 2019-201491

(51) Int. Cl.
*H01L 27/02* (2006.01)
*H02H 9/04* (2006.01)

(52) U.S. Cl.
CPC ......... *H01L 27/0248* (2013.01); *H02H 9/046* (2013.01)

(58) Field of Classification Search
CPC ............. H01L 27/0248; H01L 27/0255; H01L 21/822; H01L 27/04; H01L 27/0207; H01L 27/0288; H02H 9/046
USPC .......................................................... 361/56
See application file for complete search history.

(56) References Cited

U.S. PATENT DOCUMENTS

| 8,228,651 | B2 * | 7/2012 | Kim ..................... H01L 27/0266 |
| | | | 361/56 |
| 2005/0179088 | A1 * | 8/2005 | Glaser ................. H01L 27/0255 |
| | | | 257/356 |
| 2007/0201175 | A1 * | 8/2007 | Arai ..................... H01L 27/0255 |
| | | | 361/56 |
| 2007/0258176 | A1 * | 11/2007 | Ball ....................... H05B 45/44 |
| | | | 361/56 |

(Continued)

FOREIGN PATENT DOCUMENTS

| CN | 107112281 A | * | 8/2017 | ......... G06F 17/5072 |
| CN | 112670283 A | * | 4/2021 | ......... H01L 27/0255 |

(Continued)

OTHER PUBLICATIONS

International Search Report (ISR) dated Jan. 19, 2021 issued in International Patent Application No. PCT/JP2020/039593, with English translation.

*Primary Examiner* — Dharti H Patel
(74) *Attorney, Agent, or Firm* — McDermott Will & Emery LLP (57) ABSTRACT

In an output circuit of a semiconductor integrated circuit device, an output transistor is placed apart from an ESD protection diode connected to an external output terminal, and a protection resistance is placed between them. The protection resistance is formed as a plurality of separate resistance regions, and taps supplying a power supply voltage to a substrate or a well are formed between the resistance regions. Noise applied to the external output terminal is attenuated by the protection resistance before reaching the output transistor and absorbed through the taps.

7 Claims, 13 Drawing Sheets

(56) References Cited

U.S. PATENT DOCUMENTS

| | | | |
|---|---|---|---|
| 2007/0279824 A1* | 12/2007 | Mallikararjunaswamy | ............... H01L 27/0262 257/E29.225 |
| 2010/0155845 A1 | 6/2010 | Toba et al. | |
| 2011/0026176 A1* | 2/2011 | Kim | ............... H01L 27/0266 361/56 |
| 2013/0264647 A1 | 10/2013 | Toba et al. | |
| 2014/0198416 A1* | 7/2014 | Karp | ............... H01L 27/0251 257/360 |
| 2014/0376135 A1* | 12/2014 | Huo | ............... H01L 27/0259 361/56 |
| 2015/0043116 A1* | 2/2015 | Weyers | ............... H03K 17/74 257/272 |
| 2016/0094027 A1 | 3/2016 | Arakawa et al. | |
| 2017/0323879 A1* | 11/2017 | Twomey | ............ H03K 17/6874 |
| 2018/0197850 A1 | 7/2018 | Toba et al. | |
| 2018/0205225 A1 | 7/2018 | Arakawa et al. | |
| 2020/0203334 A1 | 6/2020 | Ito et al. | |
| 2021/0111173 A1* | 4/2021 | Liu | ............... H01L 27/0288 |
| 2021/0288145 A1* | 9/2021 | Kamibaba | ......... H01L 29/66136 |
| 2021/0408786 A1* | 12/2021 | Dundigal | ............ H03K 17/0822 |
| 2022/0262787 A1* | 8/2022 | Tanaka | ............... H01L 27/0248 |
| 2022/0376495 A1* | 11/2022 | Sun | ............... H02H 9/046 |

FOREIGN PATENT DOCUMENTS

| | | | |
|---|---|---|---|
| CN | 115241855 A | * 10/2022 | ............. H02H 9/046 |
| EP | 1289016 A2 | * 3/2003 | ............. H01L 24/05 |
| JP | 2010-147282 A | 7/2010 | |
| JP | 2011-096897 A | 5/2011 | |
| JP | 2014-064044 A | 4/2014 | |
| JP | 2016-072349 A | 5/2016 | |
| JP | 2022163499 A | * 10/2022 | |
| WO | 2019/043888 A1 | 3/2019 | |

\* cited by examiner

SEMICONDUCTOR INTEGRATED CIRCUIT DEVICE

CROSS-REFERENCE TO RELATED APPLICATIONS

This is a continuation of International Application No. PCT/JP2020/039593 filed on Oct. 21, 2020, which claims priority to Japanese Patent Application No. 2019-201491 filed on Nov. 6, 2019. The entire disclosures of these applications are incorporated by reference herein.

BACKGROUND

The present disclosure relates to a semiconductor integrated circuit device in which a core region and an I/O region are placed on a chip, and more particularly to a layout structure of an I/O cell placed in the I/O region.

In a semiconductor integrated circuit device, input/output (I/O) cells are arranged around the core region and, through the I/O cells, input/output of signals from/to the outside of the semiconductor integrated circuit device and supply of power are performed.

With the recent progress to finer semiconductor integrated circuit devices, their resistance against noise is decreasing. In particular, a latch-up phenomenon caused by noise applied from pads in I/O cells has raised a large problem.

Japanese Unexamined Patent Publication No. 2011-96897 discloses a semiconductor integrated circuit device in which a diode is provided as an electrostatic discharge (ESD) protection circuit for an external connection terminal and also a resistive element as a protection resistance is placed between an output transistor and the external connection terminal.

In the configuration disclosed in the cited patent document, the output transistor is protected from ESD by the diode as the ESD protection element and the resistive element. In this configuration, however, occurrence of a latch-up phenomenon caused by noise propagating through a well and a substrate cannot be sufficiently controlled.

An objective of the present disclosure is providing a configuration of a semiconductor integrated circuit device capable of sufficiently controlling the occurrence of the latch-up phenomenon.

SUMMARY

According to the first mode of the present disclosure, in a semiconductor integrated circuit device provided with an output circuit, the output circuit includes: an external output terminal; a first output transistor outputting an output signal to the external output terminal; a first electrostatic discharge (ESD) protection diode connected to the external output terminal; and a first protection resistance connected between the first output transistor and the first ESD protection diode, wherein the first output transistor and the first ESD protection diode are placed apart from each other, and the first protection resistance is placed between the first output transistor and the first ESD protection diode, as viewed in plan, and the first protection resistance is formed as a plurality of separate resistance regions, and taps supplying a power supply voltage to a substrate or a well are formed between the resistance regions.

According to the above mode, the output transistor is placed apart from the first ESD protection diode connected to the external output terminal, and the first protection resistance is placed between them. With this configuration, noise applied to the external output terminal is attenuated by the first protection resistance before reaching the first output transistor. Also, the first protection resistance is formed as a plurality of separate resistance regions, and taps supplying a power supply voltage to a substrate or a well are formed between the resistance regions. With this configuration, noise applied to the external output terminal is absorbed through the taps. It is therefore possible to control propagation of noise that is to be a cause of occurrence of the latch-up phenomenon.

According to the present disclosure, in a semiconductor integrated circuit device, the occurrence of the latch-up phenomenon can be sufficiently controlled.

DETAILED DESCRIPTION

Embodiments of the present disclosure will be described hereinafter with reference to the accompanying drawings. It is herein assumed that "VDDIO" and "VSS" refer to power supply voltages or power supplies themselves. It is also assumed that transistors are formed on a P-substrate and an N-well. Note however that transistors may be formed on a P-well and an N-substrate.

First Embodiment

Figure 1:
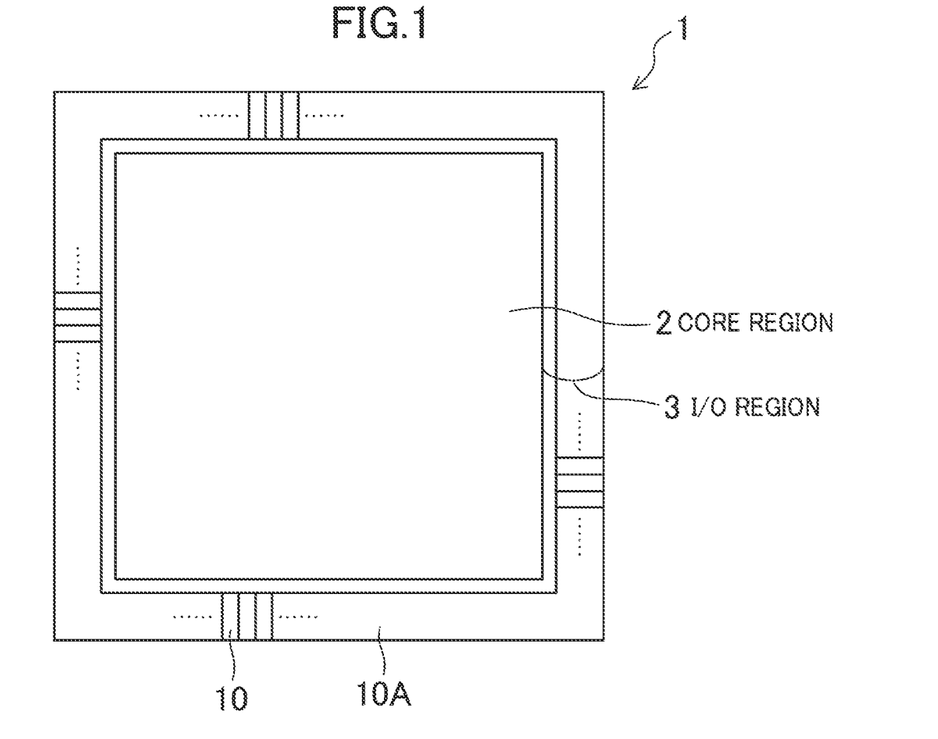
FIG. 1 is a plan view schematically showing the entire configuration of a semiconductor integrated circuit device according to an embodiment.

FIG. 1 is a plan view schematically showing the entire configuration of a semiconductor integrated circuit device according to an embodiment. A semiconductor integrated circuit device 1 shown in FIG. 1 includes a core region 2 in which inner core circuits are formed and an IO region 3, provided around the core region 2, in which interface circuits (IO circuits) are formed. In the IO region 3, an IO cell row 10A is provided to encircle the perimeter of the semiconductor integrated circuit device 1. Although illustration is simplified in FIG. 1, a plurality of IO cells 10 constituting the interface circuits are arranged in the IO cell row 10A. Also, although illustration is omitted, a plurality of external connection pads are placed in the semiconductor integrated circuit device 1.

Figure 2:
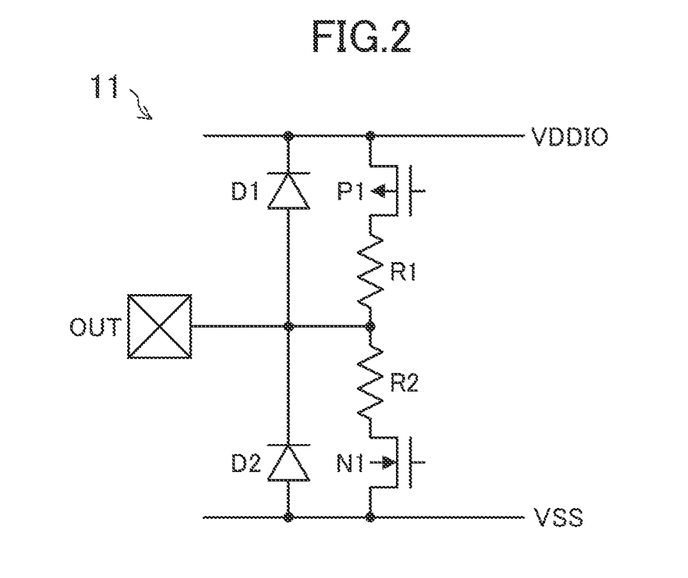
FIG. 2 is a circuit diagram of an output circuit according to the first embodiment.

FIG. 2 is a circuit diagram of an output circuit 11 included in the I/O cell 10. Note that the actual output circuit also includes circuit elements other than those shown in FIG. 2 although illustration of such elements is omitted.

The output circuit 11 shown in FIG. 2 includes an external output terminal OUT, output transistors P1 and N1, electrostatic discharge (ESD) protection diodes D1 and D2, and protection resistances R1 and R2. The output transistor Pb is a p-type transistor, and the output transistor N1 is an n-type transistor.

The output transistors P1 and N1 output an output signal to the external output terminal OUT in accordance with signals received at their gates. The output transistor P1 is connected to VDDIO at its source and to the external output terminal OUT through the protection resistance R1 at its drain. The output transistor N1 is connected to VSS at its source and to the external output terminal OUT through the protection resistance R2 at its drain. The protection resistances R1 and R2 are constituted by a wiring resistance, for example, and such wiring is implemented by interconnects formed in a diffusion layer, a gate interconnect layer, or a metal interconnect layer, or a combination thereof.

The ESD protection diode D1 is provided between VDDIO and the external output terminal OUT, and the ESD protection diode D2 is provided between VSS and the external output terminal OUT. When high-voltage noise is input into the external output terminal OUT, current flows to VDDIO and VSS through the ESD protection diodes D1 and D2, whereby the output transistors P1 and N1 are protected.

Figure 3:
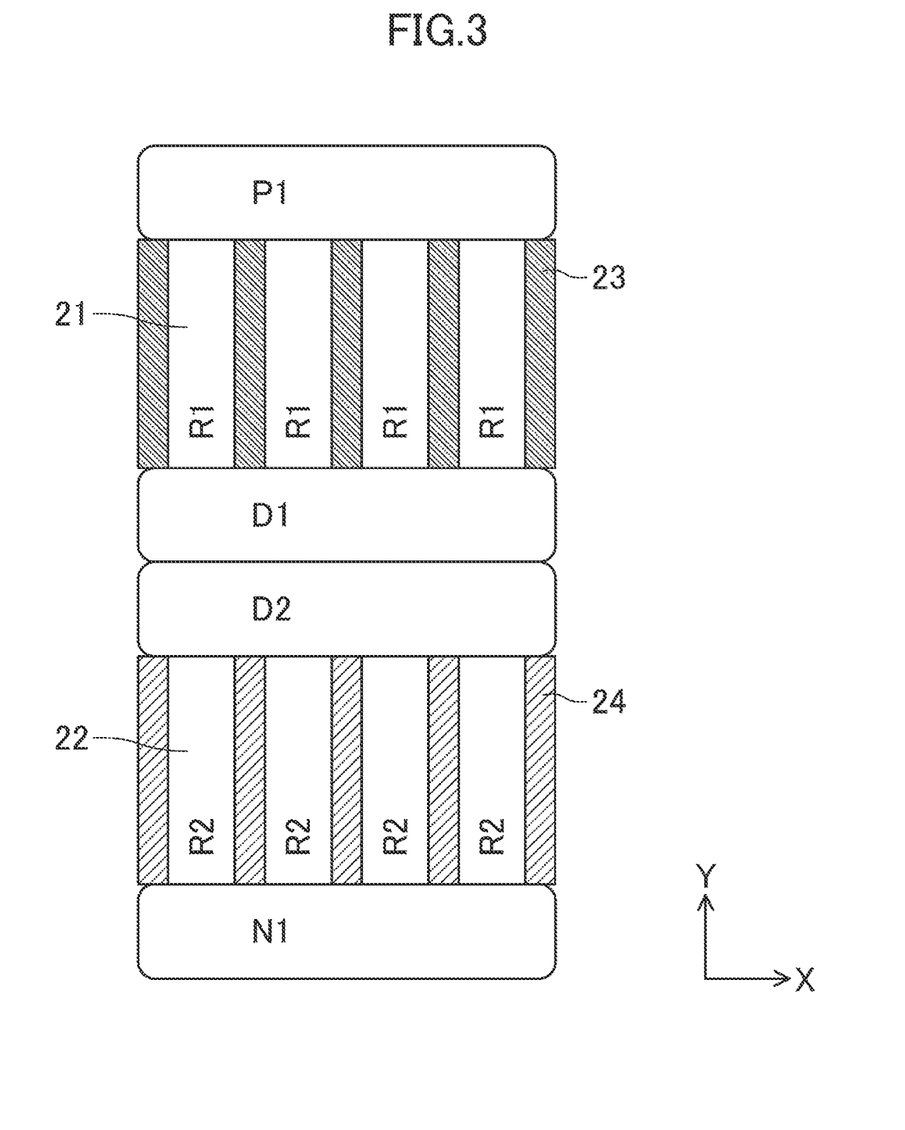
FIG. 3 shows an example of the planar layout structure of the output circuit according to the first embodiment.

FIG. 3 is a schematic view showing an example of the planar layout structure of the output circuit 11 according to this embodiment, in which the X direction (horizontal direction in the figure) is a direction along which the I/O cells 10 are arranged, and the Y direction (vertical direction in the figure) is a direction from the core region 2 side to the tip end side. The upper side in the figure is the core region 2 side, and the lower side in the figure is the tip end side. Regions in FIG. 3 corresponding to the circuit elements in the circuit diagram of FIG. 2 are denoted by the same reference characters.

The ESD protection diodes D1 and D2 are placed in the center in the Y direction. The output transistor P1 is placed above the ESD protection diode D1 in the figure in a location apart from the ESD protection diode D1. The output transistor N1 is placed below the ESD protection diode D2 in the figure in a location apart from the ESD protection diode D2.

The protection resistance R1 is placed between the output transistor P1 and the ESD protection diode D1, and formed as a plurality of separate regions (resistance regions) 21. In the example of FIG. 3, the protection resistance R1 is divided into four resistance regions 21, each in a rectangular shape extending in the Y direction, arranged in the X direction. Tap regions 23 in which taps supplying VSS to the P-substrate are formed are placed to sandwich the resistance regions 21.

The protection resistance R2 is placed between the output transistor N1 and the ESD protection diode D2, and formed as a plurality of separate regions (resistance regions) 22. In the example of FIG. 3, the protection resistance R2 is divided into four resistance regions 22, each in a rectangular shape extending in the Y direction, arranged in the X direction. Tap regions 24 in which taps supplying VDDIO to the N-well are formed are placed to sandwich the resistance regions 22.

Pads not shown are provided in a layer above the ESD protection diodes D1 and D2, for connection with the outside of the semiconductor integrated circuit device.

The layout structures of the individual circuit elements will be described hereinafter in detail.

(Layout Structure of ESD Protection Diode)

Figure 4:
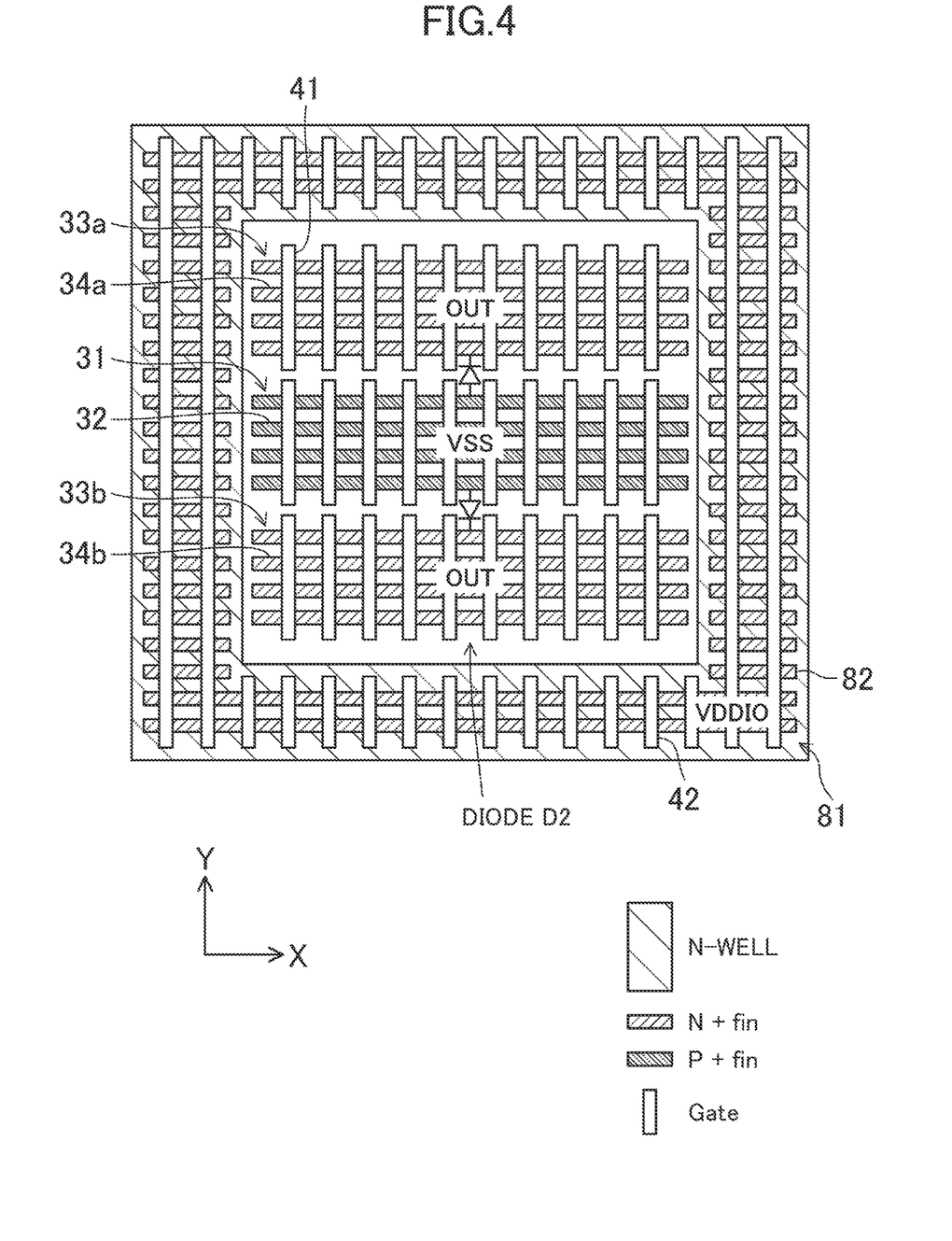
FIG. 4 shows an example of the layout structure of an ESD protection diode.

FIG. 4 shows a layout structure example of the ESD protection diode D2. Note that illustration of interconnect layers, etc. is omitted in FIG. 4.

As shown in FIG. 4, the ESD protection diode D2 is formed in the P-substrate region in the center. The ESD protection diode D2 includes an anode portion 31 formed of p-type fins 32 and cathode portions 33a and 33b formed of n-type fins 34a and 34b, respectively. The fins 32, 34a, and 34b extend in the X direction. The anode portion 31 is connected to VSS, and the cathode portions 33a and 33b are connected to the external output terminal OUT. A diode is formed between the p-type fins 32 and the n-type fins 34a and 34b.

A guard ring 81 is formed around the ESD protection diode D2. The guard ring 81 includes n-type fins 82 formed on the N-well. The fins 82 extend in the X direction, and is connected to VDDIO.

Dummy gates 41 are formed for the fins 32 of the anode portion 31 and the fins 34a and 34b of the cathode portions 33a and 33b. Dummy gates 42 are formed for the fins 82 of the guard ring 81. The dummy gates 41 and 42 extend in the Y direction. The formation of the dummy gates 41 and 42 improves the uniformity of the gate pattern in the semiconductor integrated circuit device, thereby improving the reliability and yield of the semiconductor integrated circuit device.

Note that the placement of the dummy gates 41 and 42 may be omitted. Also, the formation of the guard ring 81 may be omitted.

Figure 5:
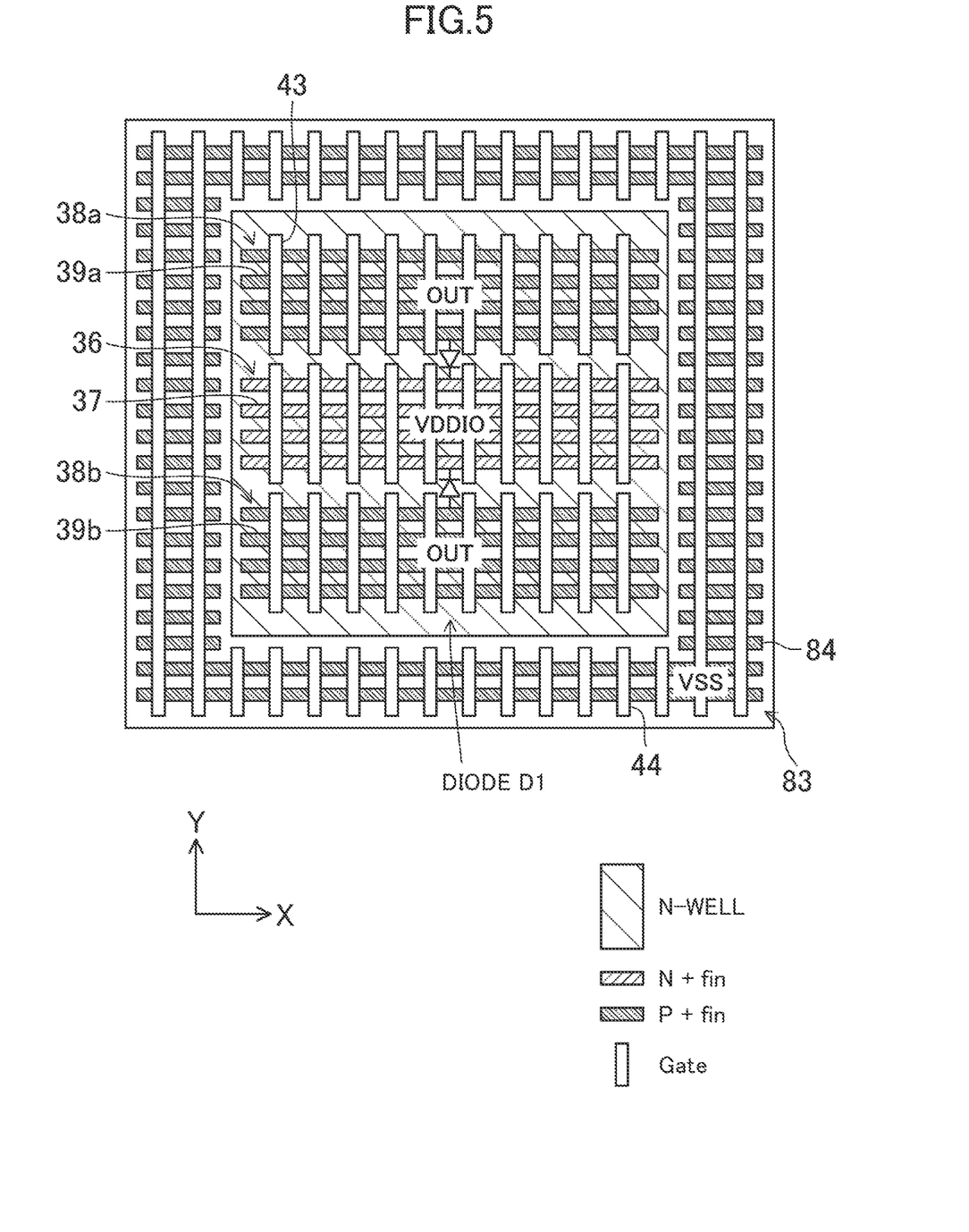
FIG. 5 shows an example of the layout structure of an ESD protection diode.

FIG. 5 shows a layout structure example of the ESD protection diode D1. Note that illustration of interconnect layers, etc. is omitted in FIG. 5.

As shown in FIG. 5, the ESD protection diode D1 is formed on the N-well in the center. The ESD protection diode D1 includes a cathode portion 36 formed of n-type fins 37 and anode portions 38a and 38b formed of p-type fins 39a and 39b, respectively. The fins 37, 39a, and 39b extend in the X direction. The cathode portion 36 is connected to VDDIO, and the anode portions 38a and 38b are connected to the external output terminal OUT. A diode is formed between the n-type fins 37 and the p-type fins 39a and 39b.

A guard ring 83 is formed around the ESD protection diode D1. The guard ring 83 includes p-type fins 84 formed in the P-substrate region. The fins 84 extend in the X direction, and is connected to VS S.

Dummy gates 43 are formed for the fins 37 of the cathode portion 36 and the fins 39a and 39b of the anode portions 38a and 38b. Dummy gates 44 are formed for the fins 84 of the guard ring 83. The dummy gates 43 and 44 extend in the Y direction. The formation of the dummy gates 43 and 44 improves the uniformity of the gate pattern in the semiconductor integrated circuit device, thereby improving the reliability and yield of the semiconductor integrated circuit device.

Note that the placement of the dummy gates 43 and 44 may be omitted. Also, the formation of the guard ring 83 may be omitted.

(Layout Structure of Protection Resistance)

Figure 6:
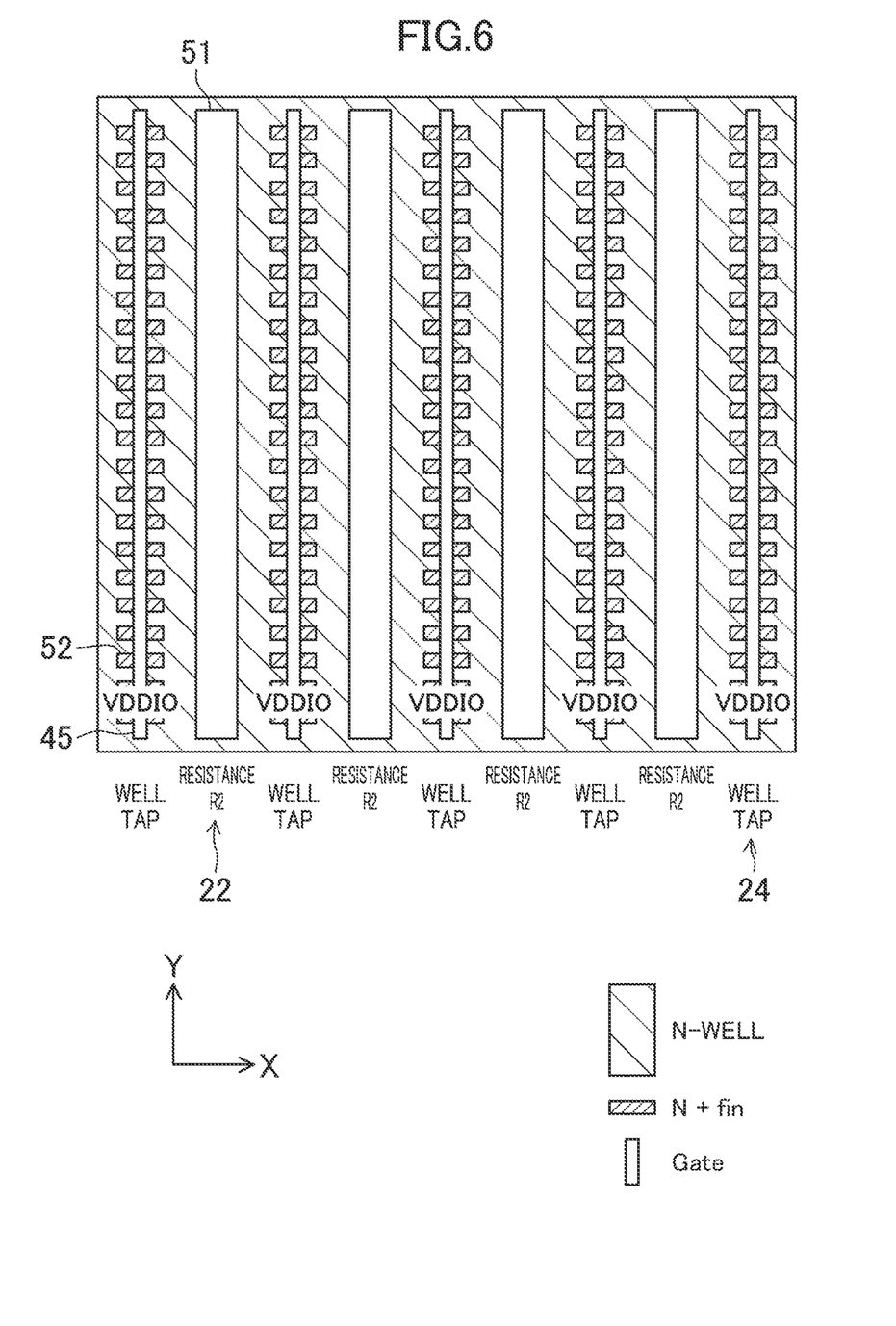
FIG. 6 shows an example of the layout structure of a protection resistance.

FIG. 6 shows a layout structure example of the protection resistance R2. Note that illustration of interconnect layers, etc. is omitted in FIG. 6.

As shown in FIG. 6, and as described with reference to FIG. 3, the protection resistance R2 is divided into four resistance regions 22 arranged in the X direction. A gate interconnect 51 is formed in each of the resistance regions 22, and such gate interconnects 51 are mutually connected through an interconnect not shown, to form one resistance or a plurality of resistances. The gate interconnects 51 are formed on the N-well.

The tap regions 24 are placed to sandwich the resistance regions 22. In the tap regions 24, n-type fins 52 are formed on the N-well, serving as taps. The fins 52 extend in the X direction, and is connected to VDDIO. Dummy gates 45 extending in the Y direction are formed for the fins 52.

While the gate interconnects 51 constituting the protection resistance are formed on the N-well, they may be formed on the P-substrate. Also, the taps in the tap regions 24 may be p-type fins formed on the P-substrate and connected to VSS.

Figure 7:
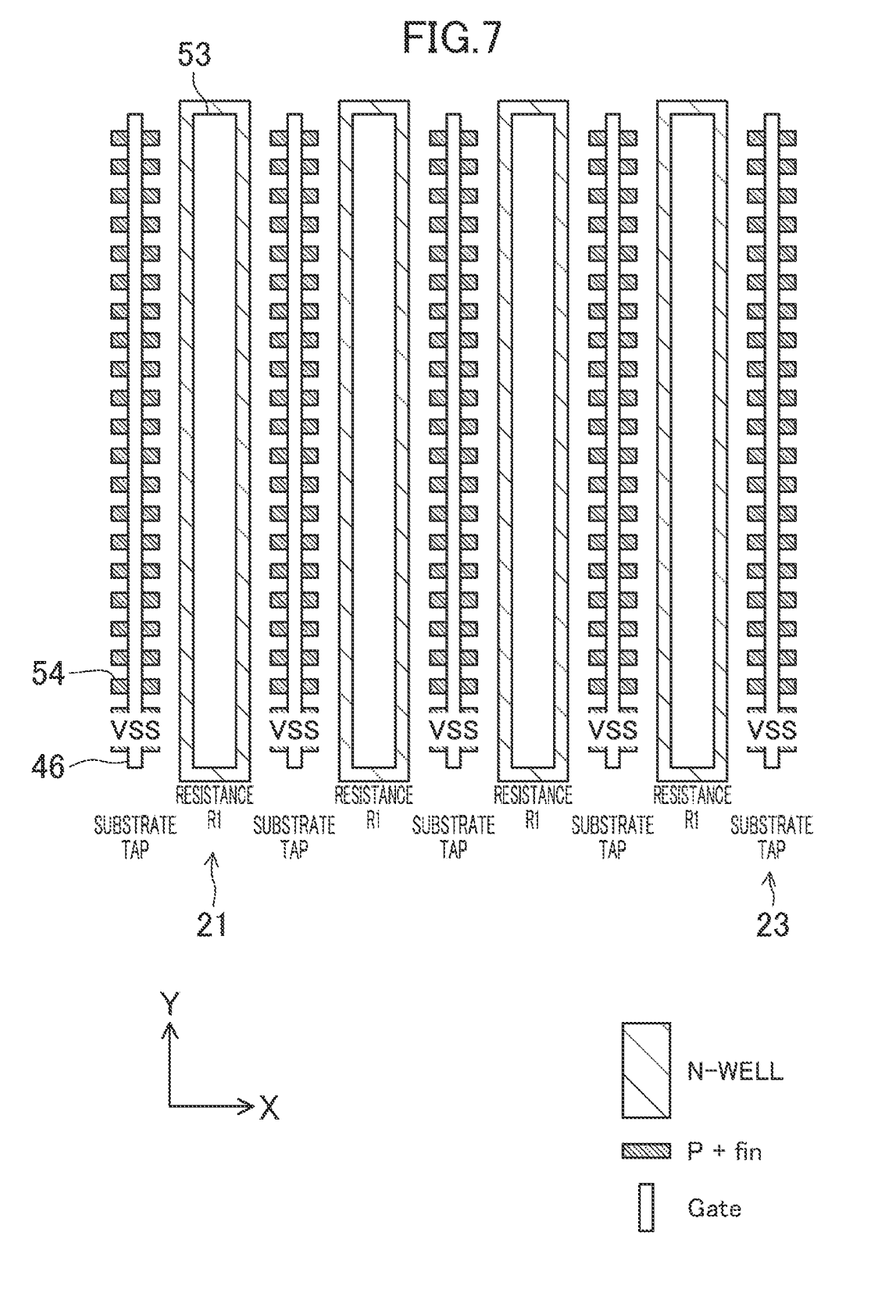
FIG. 7 shows an example of the layout structure of a protection resistance.

FIG. 7 shows a layout structure example of the protection resistance R1. Note that illustration of interconnect layers, etc. is omitted in FIG. 7.

As shown in FIG. 7, and as described with reference to FIG. 3, the protection resistance R1 is divided into four resistance regions 21 arranged in the X direction. A gate interconnect 53 is formed in each of the resistance regions 21, and such gate interconnects 53 are mutually connected through an interconnect not shown, to form one resistance or a plurality of resistances. The gate interconnects 53 are formed on the N-well.

The tap regions 23 are placed to sandwich the resistance regions 21. In the tap regions 23, p-type fins 54 are formed on the P-substrate, serving as taps. The fins 54 extend in the X direction, and is connected to VSS. Dummy gates 46 extending in the Y direction are formed for the fins 54.

While the gate interconnects 53 constituting the protection resistance are formed on the N-well, they may be formed on the P-substrate. Also, the taps in the tap regions 23 may be n-type fins formed on the N-well and connected to VDDIO.

While the protection resistance is constituted by gate interconnects in this example, the configuration is not limited to this. It may be constituted by fins, metal interconnects, etc. Otherwise, the resistance may be constituted by a combination of gate interconnects, fins, metal interconnects, etc.

Note that the placement of the dummy gates 45 and 47 may be omitted.

While the taps are assumed to have fin-structure diffusion regions in this example, the configuration is not limited to this.

(Layout Structure of Output Transistor)

Figure 8:
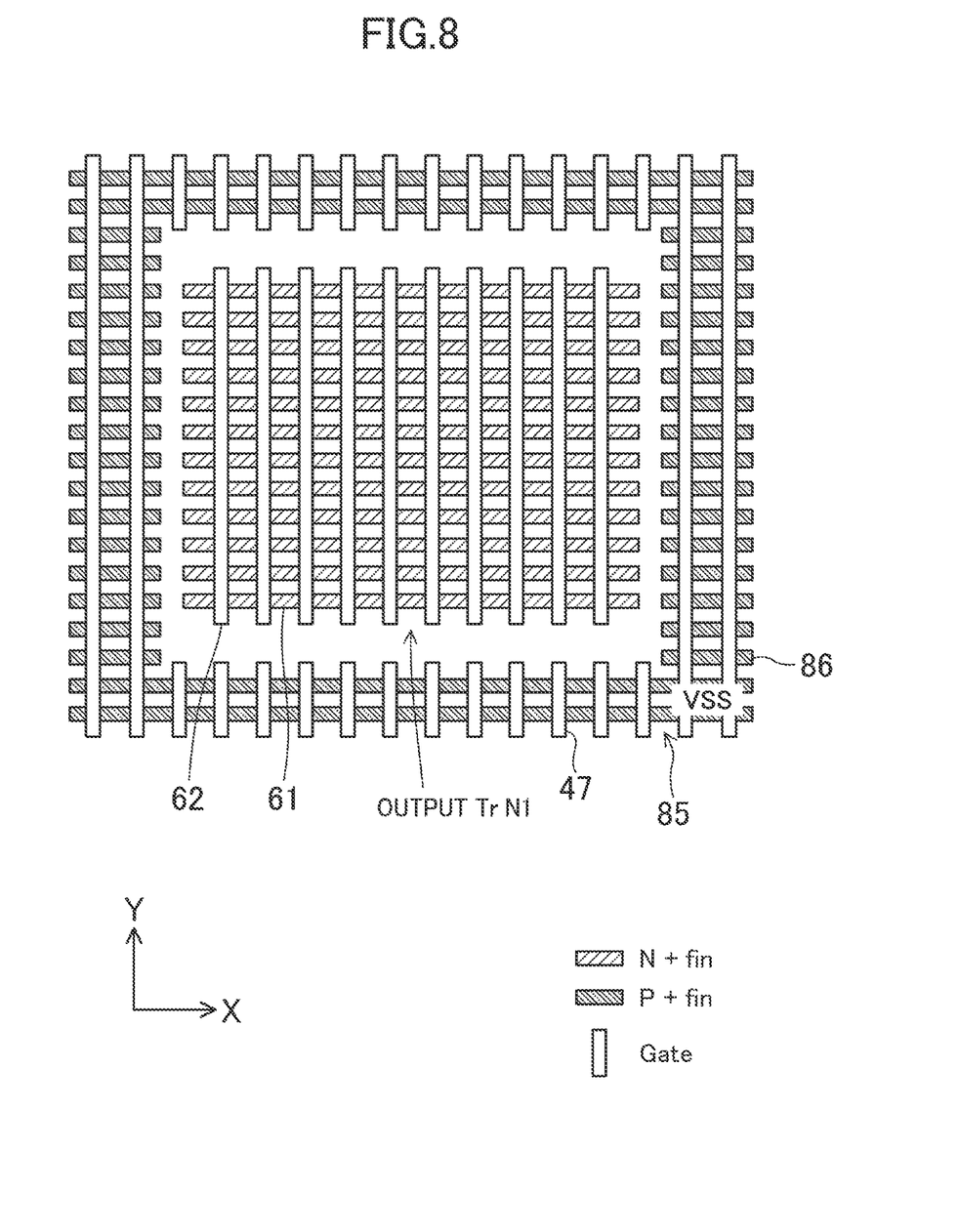
FIG. 8 shows an example of the layout structure of an output transistor.

FIG. 8 shows a layout structure example of the output transistor N1. Note that illustration of interconnect layers, etc. is omitted in FIG. 8.

As shown in FIG. 8, in the region of the output transistor N1 in the center, formed are a plurality of n-type fins 61, each extending in the X direction, arranged in the Y direction, and a plurality of gate interconnects 62, each extending in the Y direction, arranged in the X direction. Portions where the fins 61 and the gate interconnects 62 overlap each other as viewed in plan form transistors. Such transistors are connected in parallel through interconnects not shown. The drains of the transistors are connected to the external output terminal OUT through the protection resistance R2.

A guard ring 85 is formed around the output transistor N1. The guard ring 85 includes p-type fins 86 formed on the P-substrate. The fins 86 extend in the X direction, and is connected to VSS. Dummy gates 47 are formed for the fins 86.

Note that the placement of the dummy gates 47 may be omitted. Also, the formation of the guard ring 85 may be omitted.

Figure 9:
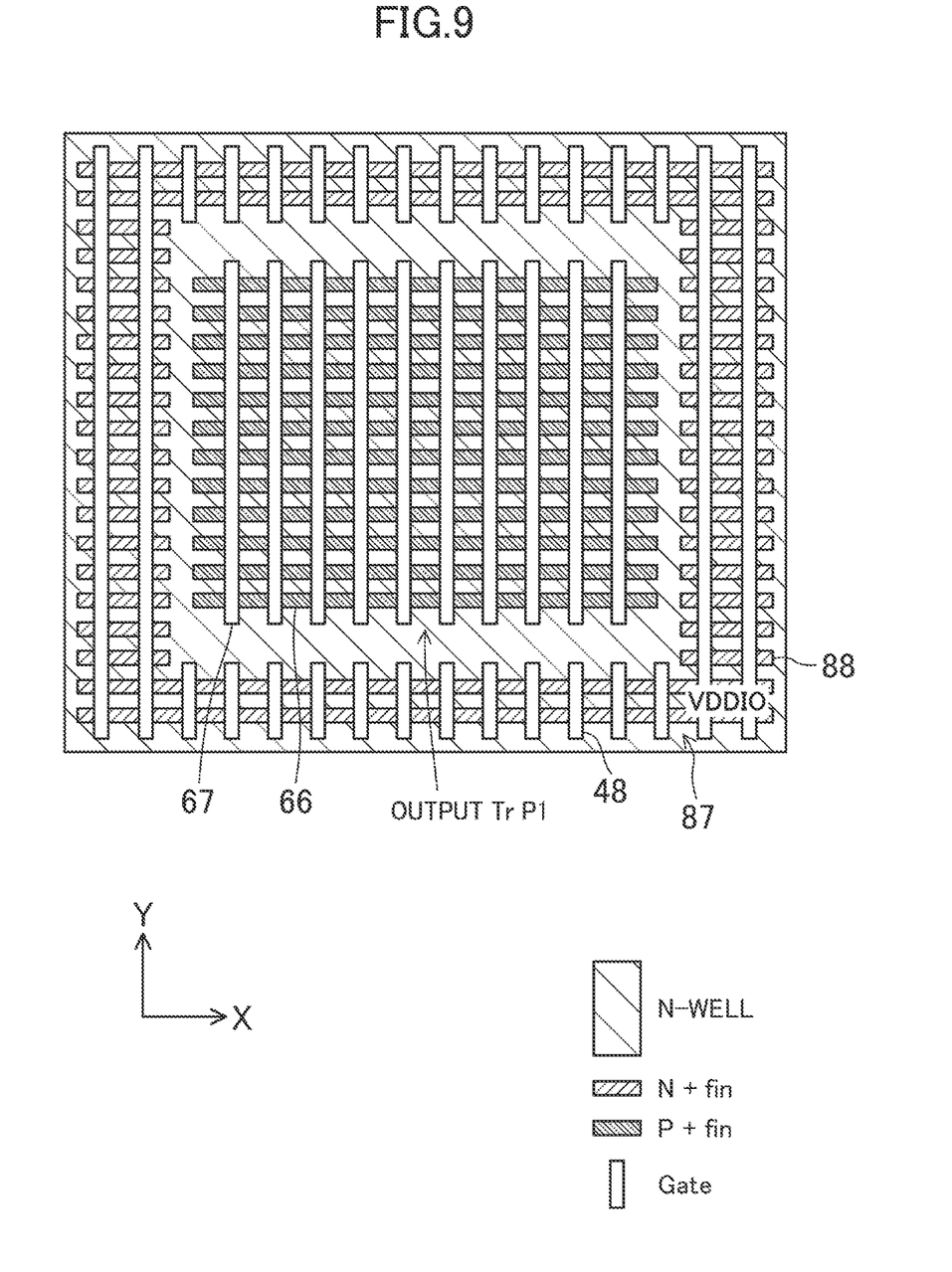
FIG. 9 shows an example of the layout structure of an output transistor.

FIG. 9 shows a layout structure example of the output transistor P1. Note that illustration of interconnect layers, etc. is omitted in FIG. 9.

As shown in FIG. 9, in the region of the output transistor P1 in the center, formed are a plurality of p-type fins 66, each extending in the X direction, arranged in the Y direction, and a plurality of gate interconnects 67, each extending in the Y direction, arranged in the X direction. Portions where the fins 66 and the gate interconnects 67 overlap each other as viewed in plan form transistors. Such transistors are connected in parallel through interconnects not shown. The drains of the transistors are connected to the external output terminal OUT through the protection resistance R1.

A guard ring 87 is formed around the output transistor P1. The guard ring 87 includes n-type fins 88 formed on the N-well. The fins 88 extend in the X direction, and is connected to VDDIO. Dummy gates 48 are formed for the fins 88.

Note that the placement of the dummy gates 48 may be omitted. Also, the formation of the guard ring 87 may be omitted.

According to this embodiment, the output transistor P1 is placed apart from the ESD protection diode D1 connected to the external output terminal OUT, with the protection resistance R1 interposed between them. The output transistor N1 is placed apart from the ESD protection diode D2 connected to the external output terminal OUT, with the protection resistance R2 interposed between them. With this configuration, noise applied to the external output terminal OUT is attenuated by the protection resistances R1 and R2 before reaching the output transistors P1 and N1. Also, the protection resistance R1 is formed as a plurality of separate resistance regions 21, and taps supplying VSS to the P-substrate are formed in the tap regions 23 provided between the resistance regions 21. The protection resistance R2 is formed as a plurality of separate resistance regions 22, and taps supplying VDDIO to the N-well are formed in the tap regions 24 provided between the resistance regions 22. With this configuration, noise applied to the external output terminal OUT is absorbed through the taps. It is therefore possible to control propagation of noise that is to be a cause of occurrence of the latch-up phenomenon. In addition, with the tap regions 23 and 24 being dispersed in a plurality of places, the effect of absorbing noise can be obtained more uniformly.

Figure 10:
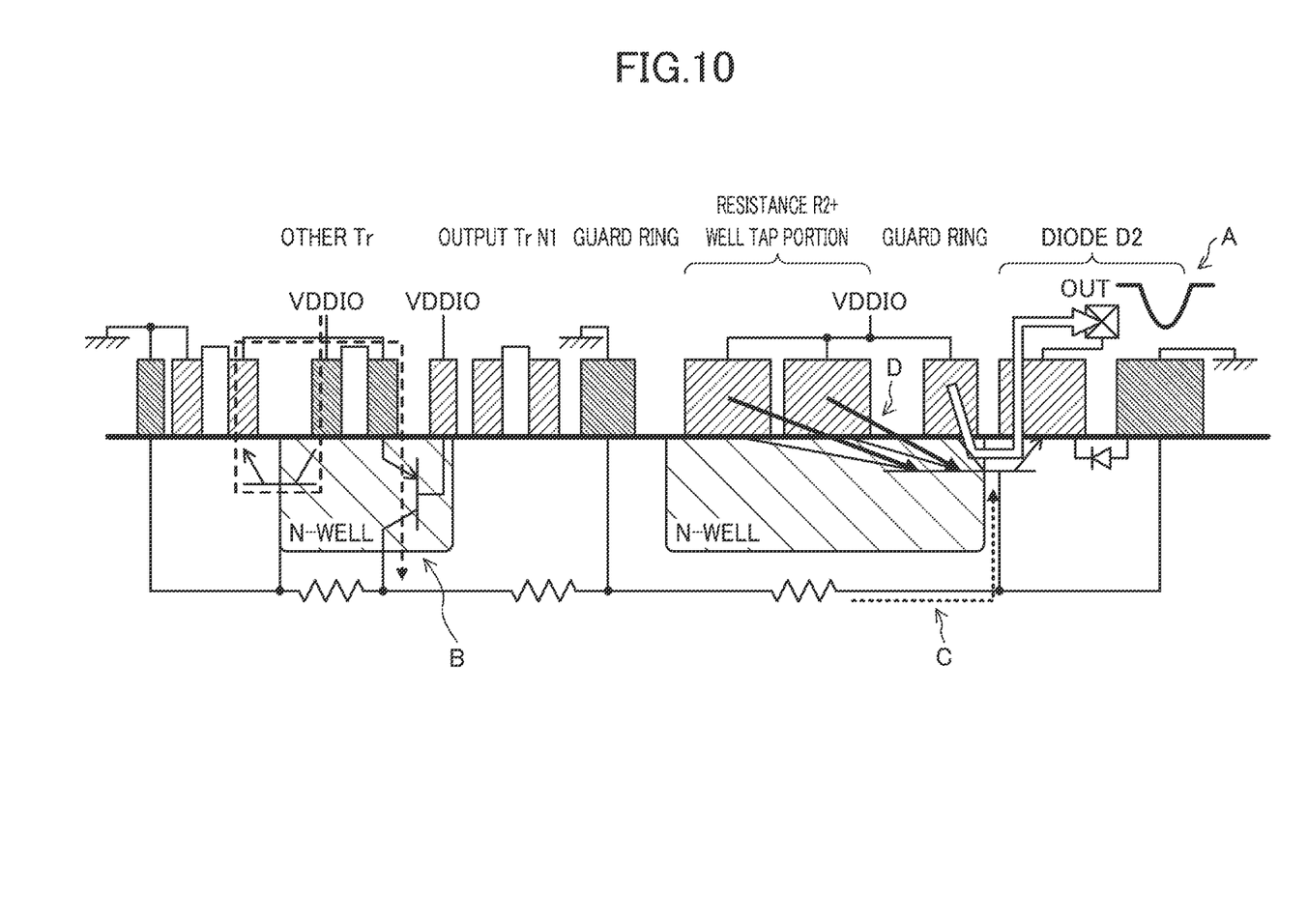
FIG. 10 shows a view for explaining how to control occurrence of a latch-up phenomenon.

Referring to FIG. 10, control of the occurrence of the latch-up phenomenon will be described. FIG. 10 is a schematic cross-sectional view of the semiconductor integrated circuit device of this embodiment, in which the ESD protection diode D2, the protection resistance R2+well tap portion (illustration of the protection resistance R2 is omitted), the output transistor N1, and other transistors are arranged sequentially from right to left.

Assume here that noise is applied to the external output terminal OUT (A in FIG. 10). If the noise propagates up to the output transistor N1 and other transistors without being sufficiently reduced, a current will flow to the base of a parasitic bipolar transistor due to the noise having propagated. This will cause a latch-up phenomenon via the parasitic transistor, resulting in occurrence of a large current between VDDIO and VSS (B in FIG. 10).

According to the configuration of this embodiment, however, noise is attenuated since the protection resistance R2 is interposed between the ESD protection diode D2 and the output transistor N1, separating the diode D2 from other transistors. Also, noise (A in FIG. 10) at the external output terminal OUT is absorbed through routes indicated by D in FIG. 10 via the taps provided in the region of the protection resistance R2, whereby fluctuations of the potential at the base node (C in FIG. 10) of the parasitic bipolar transistor can be controlled. It is therefore possible to suppress noise that may propagate up to the output transistor N1 and other transistors, and thus control the occurrence of the latch-up phenomenon.

(Alteration)

Figure 11:
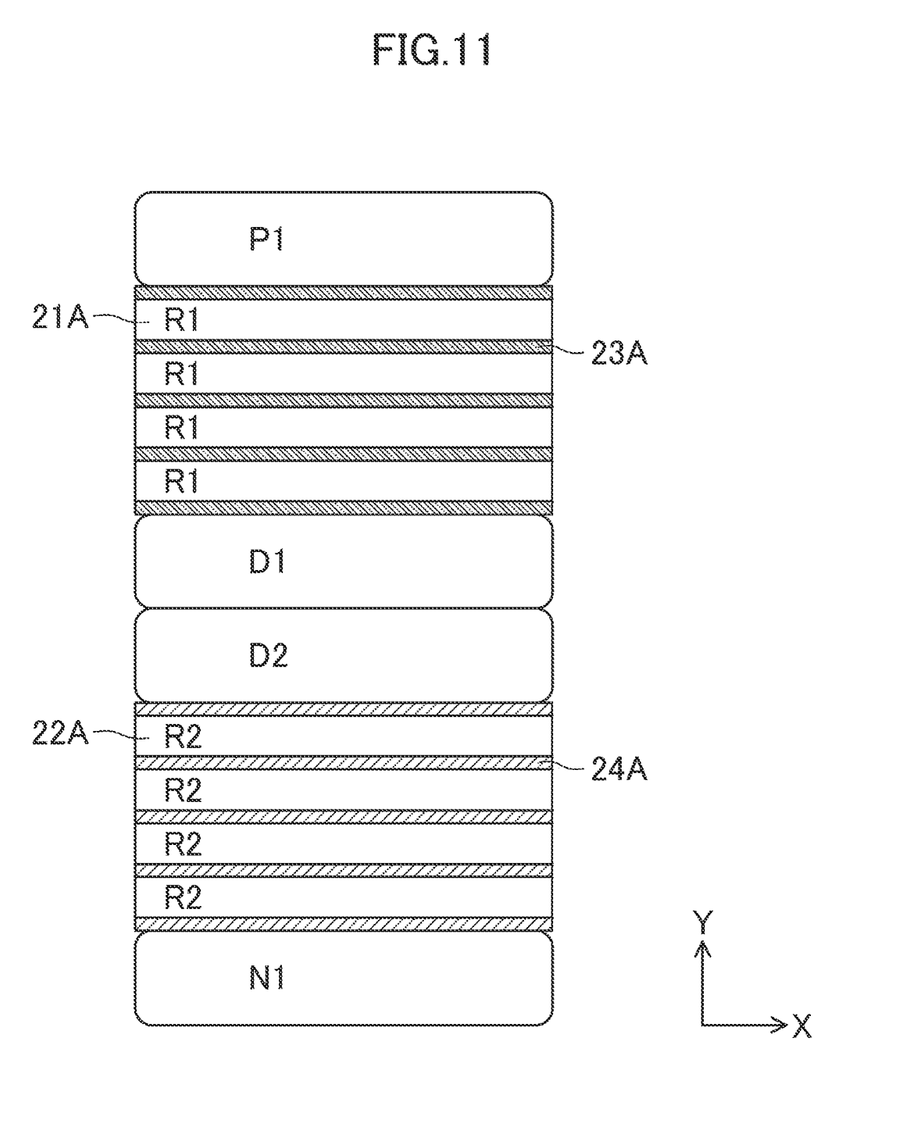
FIG. 11 shows another example of the planar layout structure of the output circuit according to the first embodiment.

FIG. 11 is a schematic view showing another example of the planar layout structure of the output circuit 11. In the example of FIG. 11, the protection resistance R1 is divided into four resistance regions 21A, each in a rectangular shape extending in the X direction, arranged in the Y direction. Tap regions 23A in which taps supplying VSS to the P-substrate are formed are placed to sandwich the resistance regions 21A.

The protection resistance R2 is divided into four resistance regions 22A, each in a rectangular shape extending in the X direction, arranged in the Y direction. Tap regions 24A in which taps supplying VDDIO to the N-well are formed are placed to sandwich the resistance regions 22A.

In this alteration, also, similar effects to those in the above embodiment are obtained. That is, noise applied to the external output terminal OUT is attenuated by the protection resistances R1 and R2 before reaching the output transistors P1 and N1. Also, noise applied to the external output terminal OUT is absorbed through the taps formed in the tap regions 23A and 24A. It is therefore possible to control propagation of noise that is to be a cause of occurrence of the latch-up phenomenon. In addition, with the tap regions 23A and 24A being dispersed in a plurality of places, the effect of absorbing noise can be obtained more uniformly.

While the protection resistances R1 and R2 are divided in the X direction in FIG. 3 and divided in the Y direction in FIG. 11, the division may be made in a mixed manner. For example, a layout in which the protection resistance R1 is divided in the X direction and the protection resistance R2 in the Y direction may be used.

Second Embodiment

Figure 12:
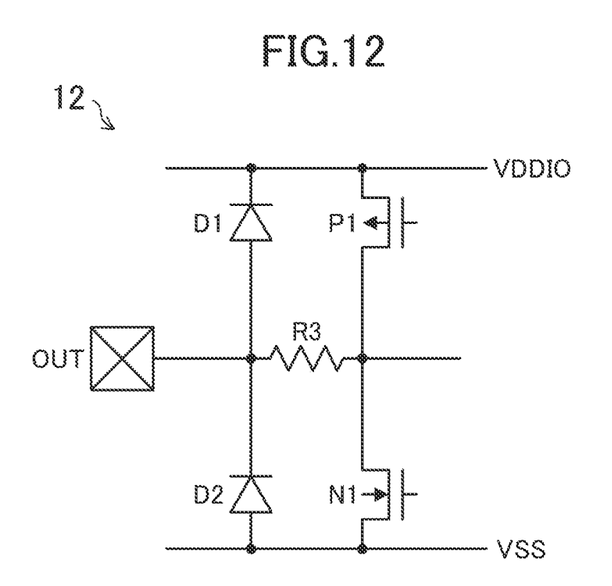
FIG. 12 is a circuit diagram of an output circuit according to the second embodiment.

FIG. 12 is a circuit diagram of an output circuit 12 according to this embodiment. The configuration of FIG. 12 is roughly the same as the circuit configuration of FIG. 2, except for the position of insertion of a protection resistance. That is, the output circuit 12 of FIG. 12 includes a protection resistance R3 in place of the protection resistances R1 and R2 in FIG. 2. In FIG. 12, the drains of the output transistors P1 and N1 are mutually connected, and the protection resistance R3 is provided between the external output terminal OUT and the drains of the output transistors P1 and N1.

Figure 13:
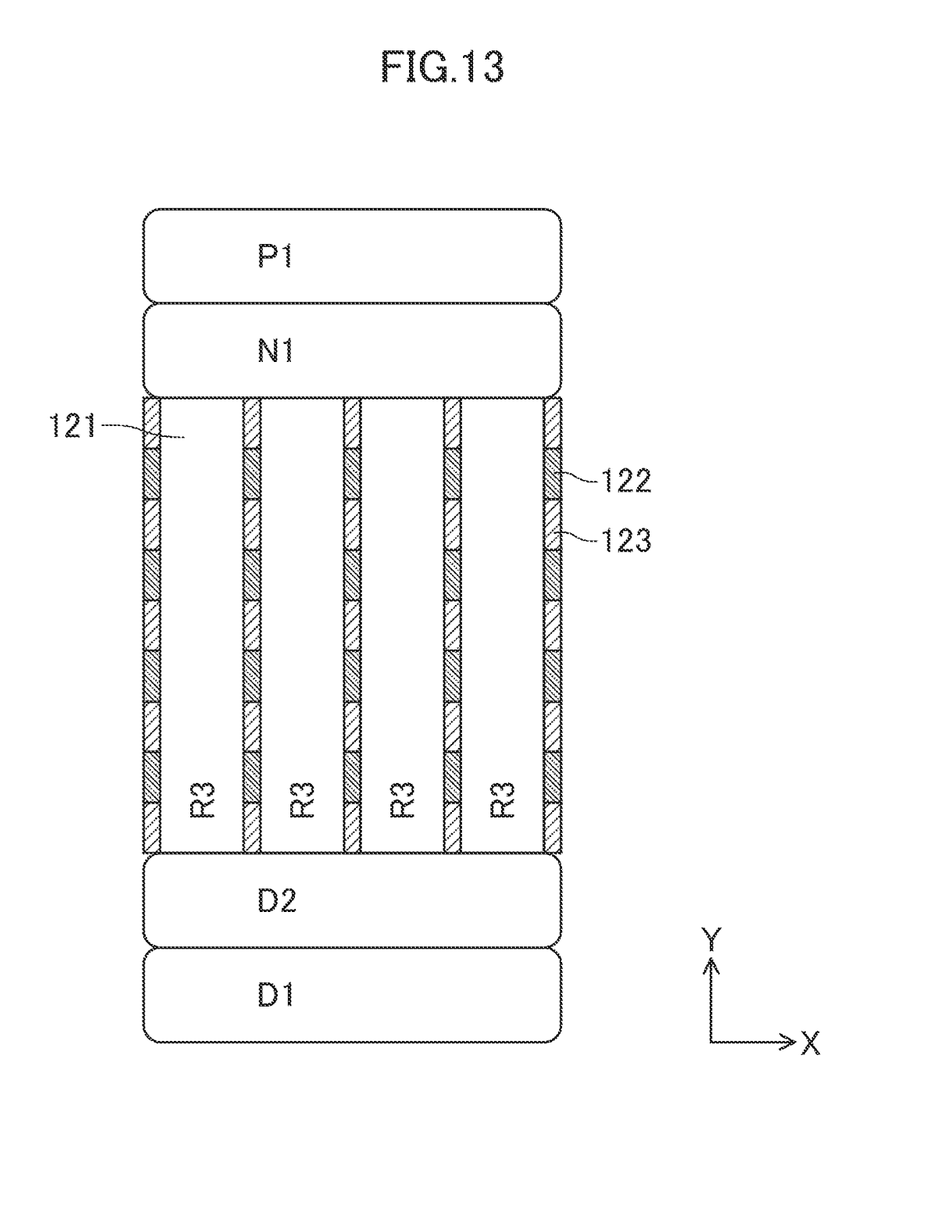
FIG. 13 shows an example of the planar layout structure of the output circuit according to the second embodiment.

FIG. 13 is a schematic view showing an example of the planar layout structure of the output circuit 12 according to this embodiment, in which the X direction (horizontal direction in the figure) is a direction along which I/O cells 10 are arranged, and the Y direction (vertical direction in the figure) is a direction from the core region 2 side to the tip end side. The upper side in the figure is the core region 2 side, and the lower side in the figure is the tip end side. Regions in FIG. 13 corresponding to the circuit elements in the circuit diagram of FIG. 12 are denoted by the same reference characters. Pads not shown are provided in a layer above the ESD protection diodes D1 and D2, for connection with the outside of the semiconductor integrated circuit device.

The ESD protection diodes D1 and D2 are placed adjacent to each other in the Y direction, and the output transistors P1 and N1 are placed adjacent to each other in the Y direction. The ESD protection diodes D1 and D2 lie in a lower part in the figure, and the output transistors P1 and N1 lie above the ESD protection diodes D1 and D2 in the figure in a location apart from the ESD protection diodes D1 and D2.

The protection resistance R3 is placed between the output transistors P1 and N1 and the ESD protection diodes D1 and D2, and formed as a plurality of separate regions (resistance regions) 121. In the example of FIG. 13, the protection resistance R3 is divided into four resistance regions 121, each in a rectangular shape extending in the Y direction, arranged in the X direction. Tap regions 122 in which taps supplying VSS to the P-substrate are formed and tap regions 123 in which taps supplying VDDIO to the N-well are formed are placed between the resistance regions 121. In the example of FIG. 13, the tap regions 122 and the tap regions 123 are placed alternately in the Y direction. That is, in a single region between the adjacent resistance regions 121, formed are the taps supplying VSS to the P-substrate and the taps supplying VDDIO to the N-well.

According to this embodiment, the output transistors P1 and N1 are placed apart from the ESD protection diodes D1 and D2 connected to the external output terminal OUT, with the protection resistance R3 interposed between them. With this configuration, noise applied to the external output terminal OUT is attenuated by the protection resistance R3 before reaching the output transistors P1 and N1. Also, the protection resistance R3 is formed as a plurality of separate resistance regions 121. Taps supplying VSS to the P-substrate are formed in the tap regions 122 between the resistance regions 121, and taps supplying VDDIO to the N-well are formed in the tap regions 123 between the resistance regions 121. With this configuration, noise applied to the external output terminal OUT is absorbed through the taps. It is therefore possible to control propagation of noise that is to be a cause of occurrence of the latch-up phenomenon. In addition, with the tap regions 122 and 123 being dispersed in a plurality of places, the effect of absorbing noise can be obtained more uniformly.

The tap regions 122 including taps supplying VSS to the P-substrate work for absorbing noise from the ESD protection diode D1, and the tap regions 123 including taps supplying VDDIO to the N-well work for absorbing noise from the ESD protection diode D2.

Note that the positions of the ESD protection diodes D1 and D2 may be changed with each other, and the positions of the output transistors P1 and N1 may be changed with each other.

(Alterations)

Figure 14A:
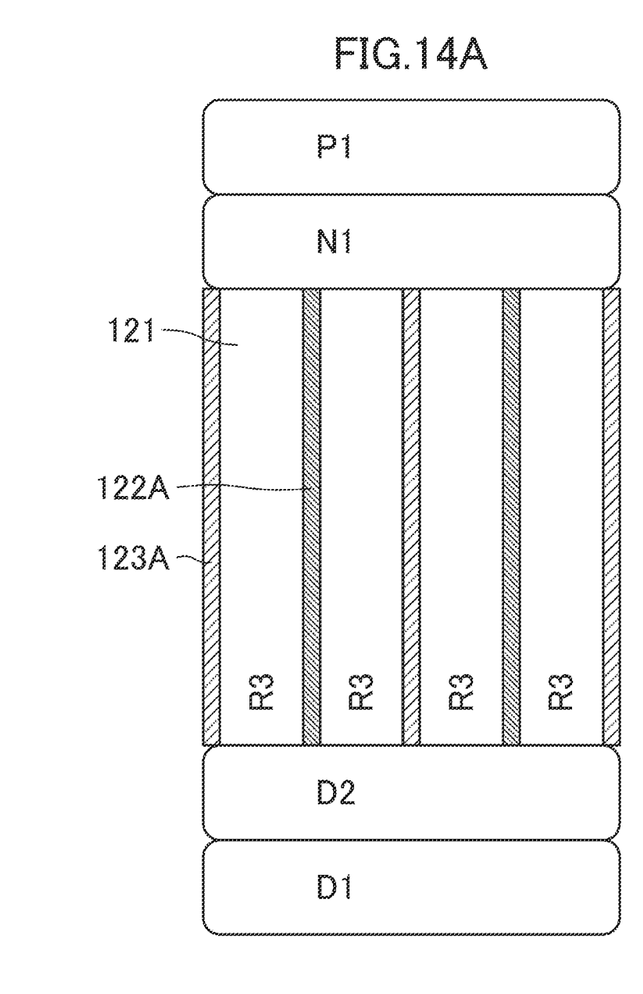
FIGS. 14A and 14B show other examples of the planar layout structure of the output circuit according to the second embodiment.
Figure 14B:
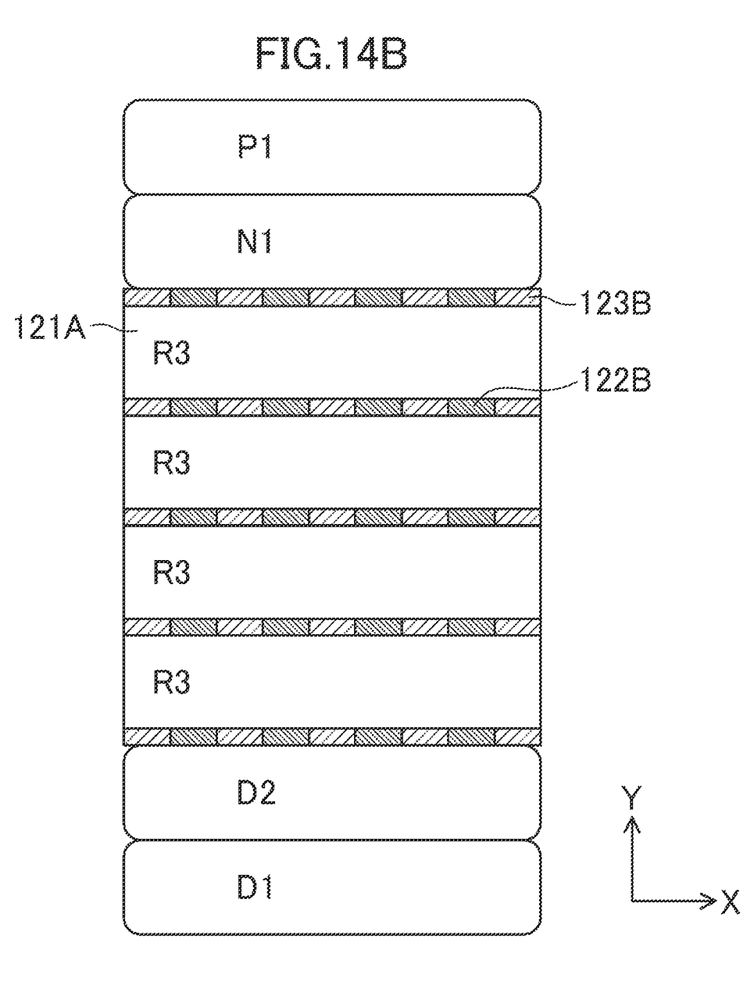

FIGS. 14A and 14B are schematic views showing other examples of the planar layout structure of the output circuit 12. In the example of FIG. 14A, tap regions 122A in which taps supplying VSS to the P-substrate are formed and tap regions 123A in which taps supplying VDDIO to the N-well are formed are placed alternately in the X direction between the resistance regions 121.

In the example of FIG. 14B, the protection resistance R3 is divided into four resistance regions 121A, each in a rectangular shape extending in the X direction, arranged in the Y direction. Tap regions 122B in which taps supplying VSS to the P-substrate are formed and tap regions 123B in which taps supplying VDDIO to the N-well are formed are placed between the resistance regions 121A. In the example of FIG. 14B, the tap regions 122B and the tap regions 123B are placed alternately in the X direction.

Note that, in the example of FIG. 14B, the tap regions 122B and the tap regions 123B may be placed alternately in the Y direction.

In these alterations, also, similar effects to those in the above embodiment are obtained. That is, noise applied to the external output terminal OUT is attenuated by the protection resistance R3 before reaching the output transistors P1 and N1. Also, noise applied to the external output terminal OUT is absorbed through the taps formed in the tap regions 122A and 123A or the tap regions 122B and 123B. It is therefore possible to control propagation of noise that is to be a cause of occurrence of the latch-up phenomenon. In addition, with the tap regions 122A and 123A or the tap regions 122B and 123B being dispersed in a plurality of places, the effect of absorbing noise can be obtained more uniformly.

In the above embodiments, while the protection resistances R1, R2, and R3 are each divided into four resistance regions, the number of resistance regions is not limited to four.

In the output circuits in the above embodiments, while the p-type output transistor and the n-type output transistor are both one-stage transistors, the transistor configuration is not limited to this. For example, the transistors may be transistors of a plurality of stages, such as two-stage transistors and three-stage transistors, connected in series. Also, the output circuits in each of the above embodiments may be an input/output circuit including an input circuit.

According to the present disclosure, the occurrence of the latch-up phenomenon can be sufficiently controlled. The present disclosure is therefore useful for improvement of the performance of semiconductor chips, for example.

What is claimed is:

1. A semiconductor integrated circuit device provided with an output circuit, the output circuit comprising:
   an external output terminal;
   a first output transistor outputting an output signal to the external output terminal;
   a first electrostatic discharge (ESD) protection diode connected to the external output terminal; and
   a first protection resistance connected between the first output transistor and the first ESD protection diode,
   wherein
   the first output transistor and the first ESD protection diode are placed apart from each other, and the first protection resistance is placed between the first output transistor and the first ESD protection diode, as viewed in plan, and
   the first protection resistance is formed as a plurality of separate resistance regions, and taps supplying a power supply voltage to a substrate or a well are formed between the resistance regions.

2. The semiconductor integrated circuit device of claim 1, wherein
   the first output transistor and the first ESD protection diode are placed apart from each other in a first direction, and
   the plurality of resistance regions are spaced from each other in a second direction perpendicular to the first direction.

3. The semiconductor integrated circuit device of claim 1, wherein
   the first output transistor and the first ESD protection diode are placed apart from each other in a first direction, and
   the plurality of resistance regions are spaced from each other in the first direction.

4. The semiconductor integrated circuit device of claim 1, wherein
   the taps have a fin-structure diffusion region.

5. The semiconductor integrated circuit device of claim 1, wherein
   in a single region between the resistance regions, taps supplying a first power supply voltage to a substrate or a well and taps supplying a second power supply voltage different from the first power supply voltage to the substrate or the well are formed.

6. The semiconductor integrated circuit device of claim 1, wherein
   the output circuit further comprises:
   a second output transistor outputting an output signal to the external output terminal;
   a second ESD protection diode connected to the external output terminal; and
   a second protection resistance connected between the second output transistor and the second ESD protection diode,
   the second output transistor and the second ESD protection diode are placed apart from each other, and the second protection resistance is placed between the second output transistor and the second ESD protection diode, as viewed in plan, and
   the second protection resistance is formed as a plurality of separate second resistance regions, and taps supplying a power supply voltage to a substrate or a well are formed between the second resistance regions.

7. The semiconductor integrated circuit device of claim 1, wherein
   the output circuit further comprises:
   a second output transistor outputting an output signal to the external output terminal; and
   a second ESD protection diode connected to the external output terminal,
   the second output transistor is placed adjacent to the first output transistor, and the second ESD protection diode is placed adjacent to the first ESD protection diode, as viewed in plan, and
   the first protection resistance is placed between the first and second output transistors and the first and second ESD protection diodes.

* * * * *